(12) United States Patent
Partiwala et al.

(10) Patent No.: US 9,916,876 B2
(45) Date of Patent: Mar. 13, 2018

(54) ULTRA LOW POWER ARCHITECTURE TO SUPPORT ALWAYS ON PATH TO MEMORY

(71) Applicant: INTEL CORPORATION, Santa Clara, CA (US)

(72) Inventors: Suketu R. Partiwala, Chandler, AZ (US); Prashanth Kalluraya, Foster City, CA (US); Bruce L. Fleming, Morgan Hill, CA (US); Shreekant S. Thakkar, Portland, OR (US); Kenneth D. Shoemaker, Los Altos Hills, CA (US); Sridhar Lakshmanamurthy, Sunnyvale, CA (US); Sami Yehia, Portland, OR (US); Joydeep Ray, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 223 days.

(21) Appl. No.: 14/336,128

(22) Filed: Jul. 21, 2014

(65) Prior Publication Data
US 2016/0019936 A1    Jan. 21, 2016

(51) Int. Cl.
| | |
|---|---|
| *G11C 5/14* | (2006.01) |
| *G06F 1/26* | (2006.01) |
| *G06F 1/18* | (2006.01) |
| *G06F 1/32* | (2006.01) |

(52) U.S. Cl.
CPC .............. *G11C 5/148* (2013.01); *G06F 1/189* (2013.01); *G06F 1/26* (2013.01); *G06F 1/32* (2013.01); *G06F 1/3275* (2013.01); *Y02B 60/1228* (2013.01)

(58) Field of Classification Search
CPC ........... G11C 5/14; G11C 5/147; G11C 5/148; G06F 1/189; G06F 1/26; G06F 1/32; G06F 1/3275
USPC .................................................. 365/227, 226
See application file for complete search history.

(56) References Cited

U.S. PATENT DOCUMENTS

| | | | |
|---|---|---|---|
| 6,775,785 B1 * | 8/2004 | Hart ...................... | G06F 9/4418 713/323 |
| 8,766,707 B1 | 7/2014 | Younger et al. | |
| 2005/0064829 A1 | 3/2005 | Kang et al. | |
| 2009/0204834 A1 | 8/2009 | Hendin et al. | |
| 2009/0204837 A1 | 8/2009 | Raval et al. | |
| 2014/0016392 A1 * | 1/2014 | McCombs ............... | G11C 7/06 365/72 |
| 2014/0057587 A1 | 2/2014 | Overby | |

FOREIGN PATENT DOCUMENTS

JP          05-298217          11/1993

OTHER PUBLICATIONS

International Search Report for PCT Application No. PCT/PCT2015/037193, dated Oct. 13, 2015, 3 pages.

*Primary Examiner* — Huan Hoang
(74) *Attorney, Agent, or Firm* — International IP Law Group, P.L.L.C.

(57) ABSTRACT

An apparatus with an ultra low power architecture is described herein. The apparatus includes a first power supply rail, wherein a plurality of subsystems are to be powered by the first power supply rail. The apparatus also includes a second power supply rail, wherein a plurality of autonomous subsystems are to be powered by the power supply rail, wherein the second power supply rail is to be always on, always available, and low power.

22 Claims, 4 Drawing Sheets

ULTRA LOW POWER ARCHITECTURE TO SUPPORT ALWAYS ON PATH TO MEMORY

TECHNICAL FIELD

The present techniques generally relate to memory access. More specifically, the present techniques relate to an always available ultra low power path to memory.

BACKGROUND ART

Mobile SOCs include a plurality of autonomous subsystems, such as a modem, audio subsystem, sensors or sensor hub, cryptography subsystems, and the like, which should be active during all system power states. Computing devices can typically enter a number of varying power states. Each of the autonomous subsystems may be designed with an internal memory capability that maximizes energy efficiency based upon the workloads of those subsystems. SOCs with integrated subsystems may consume power to make a data path to memory available and also maintaining the quality of service (QoS) requirements from each subsystem. Using a common data path to memory may not satisfy latency requirements of the subsystems.

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

Figure 1:
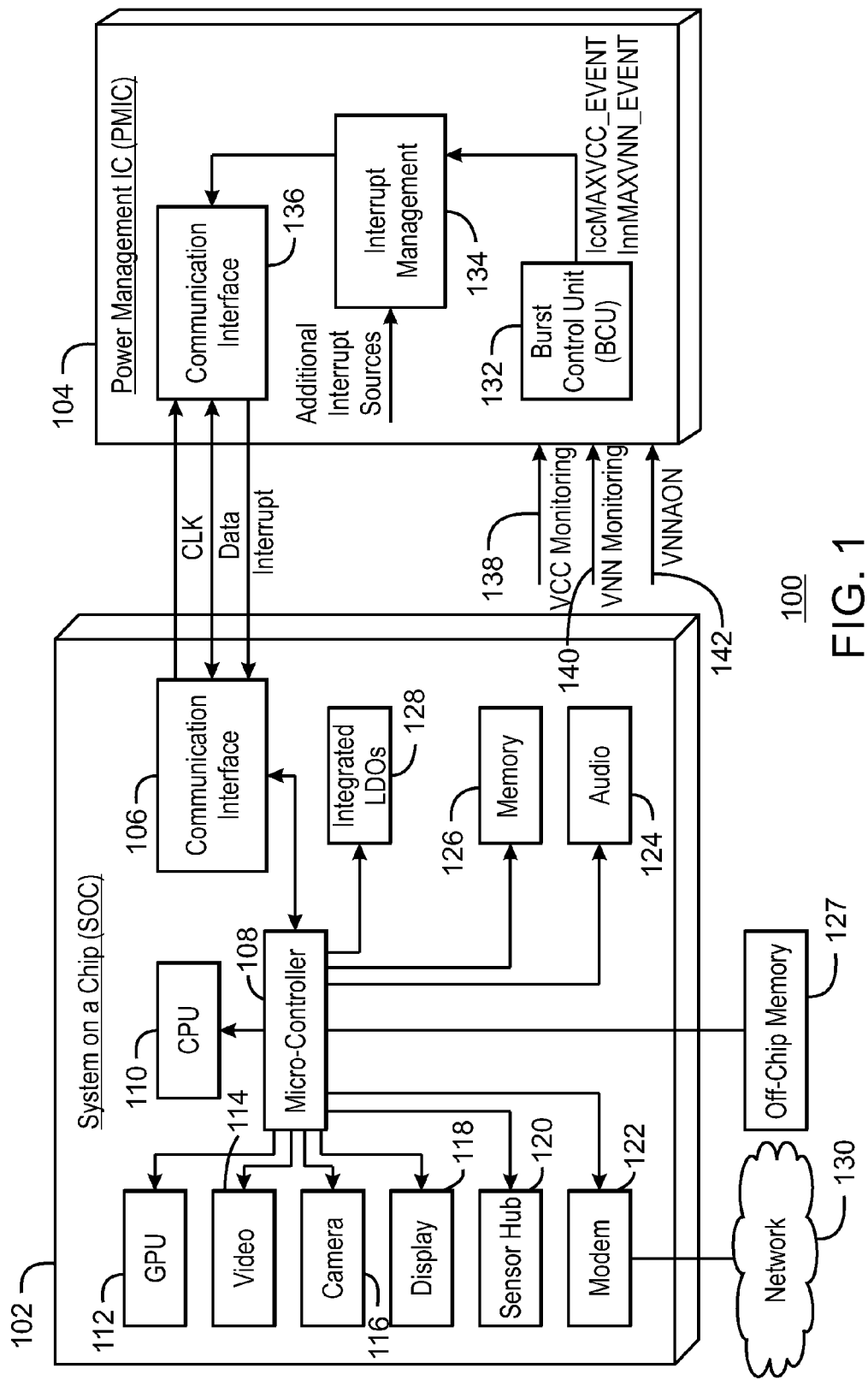
FIG. 1 is a block diagram of a computing system.

As noted above, computing devices can typically enter a number of varying power states. Depending on the particular operating system, the states may be referred to as "S" states. For example, S0 may be an active state, S3 may be a standby state, S4 may be a hibernate state, and S5 may be an off state. Further sleep states may be implemented across interfaces and subsystems of a computing device during an S0 active state, and can be referred to as S0ix states. In the S0ix state, various subsystems can be in reduced power modes, even though the system is in an S0 (active) state. In the S0ix state, the "i" may represent an idleness period within an S0 state, and the "x" may represent a placeholder for the duration of the idleness period, with larger values of "x" representing longer durations.

In any given SOC, typically a single path to main memory is used by all subsystems. Depending on the architecture of the SOC, when waking one subsystem from an S0ix state may cause other subsystems to exit the S0ix state and consume power. Embodiments described herein enable an extremely low power, always available, always on (AON) path to main memory for the subsystems. In embodiments, the AON path to memory is used with subsystems that remain active during all system states, including deep S0ix states. Some subsystems can exit the S0ix state and access the AON path to memory, while other subsystems remain in the S0ix state.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infra-red signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments. Elements or aspects from an embodiment can be combined with elements or aspects of another embodiment.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

FIG. 1 is a block diagram of a computing system 100. The computing device 100 may be, for example, a laptop computer, desktop computer, tablet computer, ultrabook, mobile device, or server, among others. The computing device 100 may include a system on a chip (SOC) 102. The SOC 102 may interface with a power management integrated chip (PMIC) 104. The SOC 102 illustrated herein may include components such as a communication interface 106 in communication with a microcontroller 108. The microcontroller 108 may be operatively communicable with several other subsystems, including a central processing unit (CPU) 110, a graphics processing unit (GPU) 112 a video component 114, a camera 116, a display 118, a sensor hub 120, a modem 122, audio 124, one or more memories 126, and one or more integrated low dropout regulators (LDOs) 128. In some scenarios, the CPU 110 can be powered by a $V_{CC}$ power supply rail while the GPU 112, video component 114, camera 116, display 118, sensor hub 120, modem 122, audio 124, memories 126 and LDOs 128 are powered by the $V_{NN}$ power supply rail. In embodiments, always available subsystems such as the like sensor hub 120, modem 122, and audio 124 are powered by an Always ON power supply ($V_{NNAON}$).

The GPU 112 may be configured to perform any number of graphics operations within the computing system 100. For example, the GPU 112 may be configured to render or manipulate graphics images, graphics frames, videos, or the like, to be displayed to a user of the computing system 100. The display 118 may be coupled include a display screen that is a built-in component of the computing system 100. The display 118 may also be coupled with a computer monitor, television, or projector, among others, that is externally connected to the computing device 100.

The sensor hub 120 may be considered an autonomous subsystem that integrates and processes data from various sensors. In some cases, an autonomous subsystem is a subsystem that can function independently of the CPU, GPU, or other subsystems, and can respond or react independently. An autonomous subsystem may also be a subsystem that does not require the use of a computer operating system to coordinate and/or control all aspects of the subsystem operation. Thus, an autonomous subsystem does not need an operating system to access a memory subsystem as described according to the present techniques. As a result, an autonomous subsystem for memory access purposes exists independently, and without outside control of an operating system may respond and/or react on its own.

The modem 122 may include various antennas into order to transmit and receive wireless data, and may also be an autonomous subsystem. The modem 122 may be configured to connect the computing system 100 through the bus 106 to a network 130. The network 130 may be a wide area network (WAN), local area network (LAN), or the Internet, among others. In a mobile SOC, the modem 122 may connect the mobile device to a base station. The audio subsystem may be connected to a plurality of speakers and sound output devices. In some cases, the audio subsystem 124 is an autonomous subsystem. The memory 126 can include random access memory (RAM), read only memory (ROM), flash memory, or any other suitable memory systems. For example, the memory 126 may include dynamic random access memory (DRAM) or static random access memories (SRAMs). The SOC may also be coupled with off-chip memory 127. The off-chip memory 127 may include, for example, DRAM or SRAMs.

In some cases, the sensor hub 120, modem 122, audio subsystems 124 are autonomous, active, and accessing memory, while the remainder of subsystems on the SOC 102 are in an S0ix sleep state. Autonomous subsystems such as the sensor hub 120, modem 122, audio subsystem 124 can be placed low in a fabric hierarchy of the SOC 102. Waking the autonomous subsystems to access the memory subsystem 126 can result in waking all fabrics and subsystems, as the autonomous subsystems are low in the fabric hierarchy. A $V_{NNAON}$ power supply rail can enable the autonomous subsystems to be powered on and accessing the memory subsystem 126 without causing other subsystems to exit a sleep state. In an example, the CPU 110 can be powered by the $V_{CC}$ power supply rail, while the GPU 112, video 114, camera 116, display 118, and LDOs 128 can be powered by the $V_{NN}$ power supply rail. An always available, always on $V_{NNAON}$ power supply rail can be used to power autonomous subsystems, such as the sensor hub 120, the modem 122, and the audio 124. As used herein, always available refers to the power being on during S0ix states and any other deep sleep state that would typically power off a power supply rail. The $V_{NN}$ power supply rail, the $V_{CC}$ power supply rail, or any combination thereof may be a first power supply rail and can power a plurality of subsystems. The $V_{NNAON}$ power supply rail may be a second power supply rail, and can power a plurality of autonomous subsystems, where the $V_{NNAON}$ power supply rail is to be always on and low power.

The PMIC 104 may include additional components such as a burst control unit (BCU) 132, an interrupt management component 134, and a communication interface 136. The BCU 132 may be operative to receive and process data from one or more comparators indicative of current levels on power supply rails such as a $V_{CC}$ power supply rail, a $V_{NN}$ power supply rail, and a $V_{NNAON}$ power supply rail of the SOC 102. Accordingly, a $V_{CC}$ power supply rail monitoring is illustrated at reference number 138. A $V_{NN}$ power supply rail monitoring is illustrated at reference number 140 and a $V_{NNAON}$ power supply rail monitoring is illustrated at reference number 142. In some cases, the operable to provide a plurality of power states, wherein the PMIC can transition an autonomous subsystem from a sleep state to an active state, where the autonomous subsystem is active and powered by a low power always on $V_{NNAON}$ power supply rail while a second subsystem is to remain in the sleep state and is powered by the $V_{NN}$ power supply rail, the $V_{CC}$ power supply rail, or any combination thereof.

The outcome of such current monitoring on the various power supply rails may be sent to the interrupt management component 134 for further processing. The interrupt management component 134 may be operative to create an interrupt when the monitored current level crosses a threshold setting. The threshold setting may also be referred to as a programmable trip point. The interrupt may include data indicative of whether the current level on the power supply rails has crossed a threshold setting into an excessive level or has crossed the threshold setting back into a normal level. The interrupt may then be forwarded to the communication interface 136 on the PMIC 104. The communication interface 136 may then forward the interrupt out of the PMIC 104 to the SOC 102. Although a PMIC 104 is described, the PMIC is not required for use with the present techniques.

In a typical mobile SOC, the main SOC power rail $V_{NN}$ is powered off during an S0ix power state. In some cases, the PMIC toggles the $V_{NN}$ power supply rail during the S0ix power state. As a result, the main rail $V_{NN}$ is powered up and down for any memory access by autonomous subsystems when there is not an Always On path to memory. There are costs associated with toggling the $V_{NN}$ rail in terms of communication latency to PMIC and energy needed to bring the system in a state to be able to communicate. The present techniques avoid these costs by removing the need to frequently toggle the $V_{NN}$ rail. Rather, the $V_{NNAON}$ power supply rail can be used for several autonomous subsystems without waking other subsystems and powering on the $V_{NN}$ power supply rail.

The block diagram of FIG. 1 is not intended to indicate that the system 100 is to include all of the components shown in FIG. 1. Further, the system 100 may include any number of additional components not shown in FIG. 1, depending on the details of the specific implementation. Moreover, the SOC 102 is exemplary. Other components or combinations of components may be used depending on the specific environment and function of the SOC 102. The embodiments are not limited to the example of SOC 102.

Figure 2:
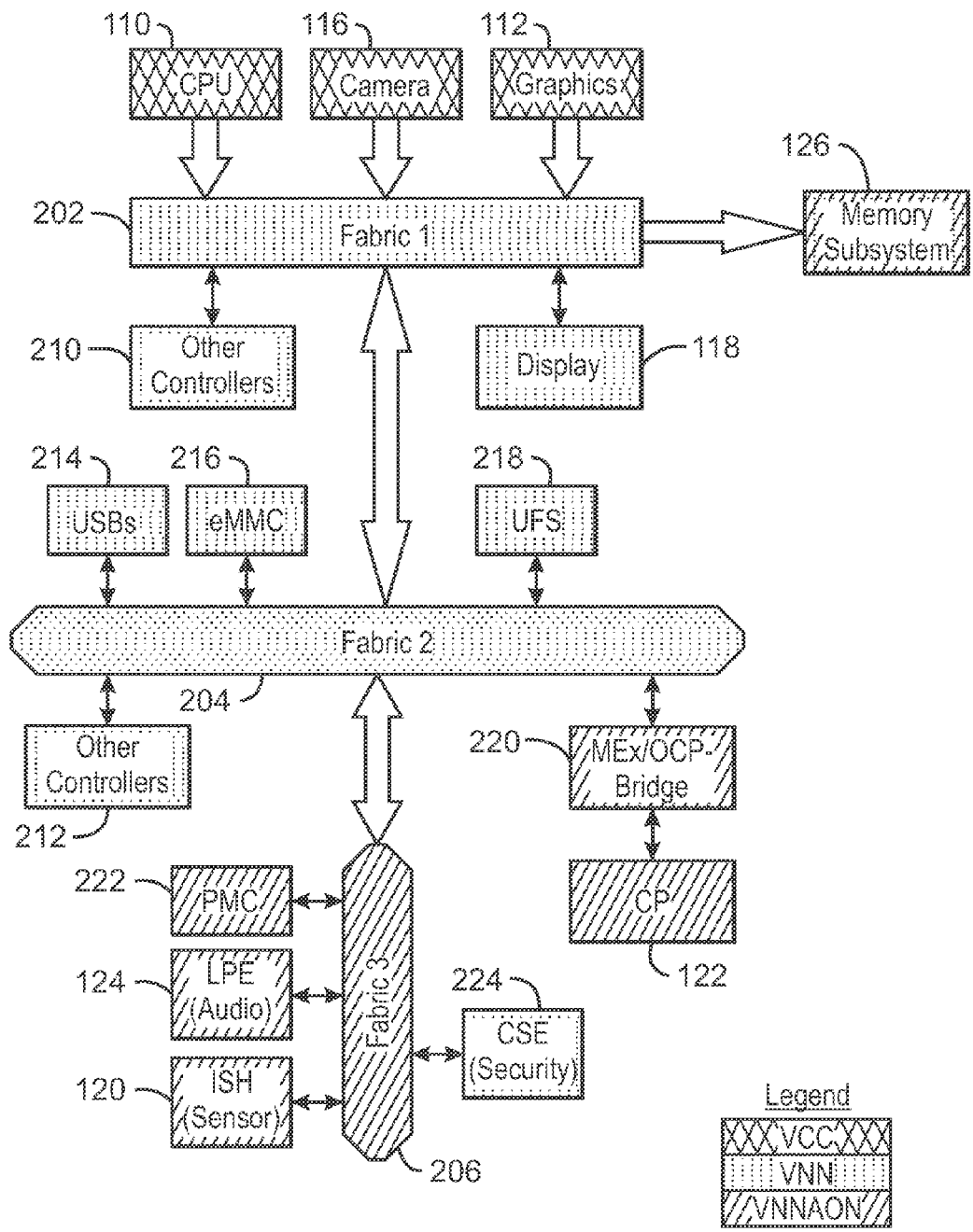
FIG. 2 is a block diagram of an SOC.

FIG. 2 is a block diagram of an SOC 200. The SOC 200 includes a fabric 202, a fabric 204, and a fabric 206. In examples, a fabric is a grouping of nodes connected by high bandwidth interconnects. Each subsystem can be considered a node connected to the fabric. Additionally, each fabric can be connected in a hierarchal fashion.

As illustrated, the fabric 202 is the highest fabric in the hierarchy. The fabric 202 interconnects the CPU 110, the camera 116, the graphics subsystem 112, the display 118, and other controllers 210. The other controllers 210 include, but are not limited to debug units, speech recognition units, and any other general integrated package (IP). The next fabric in the hierarchy is the fabric 204. The fabric 204 connects several controllers 212. In some cases, the other controllers 212 include, but are not limited to Universal Serial Bus (USB) controllers, storage IPs, and any other general IP. The fabric 204 also connects USB subsystems 214, an Embedded Multimedia Controller (eMMC) subsystem 216, and a Universal Flash Storage (UFS) subsystem 218. The fabric 204 also connects a modem 122 via an Open Core Protocol (OCP) bridge 220. The fabric 206 connects a Power Management Controller (PMC) 222, an audio subsystem 124, a sensor hub 120, and a communications security establishment (CSE) subsystem 224. Although certain subsystems and controllers are illustrated as attached to the SOC 200 through particular fabrics, the arrangement of the various the present techniques can be used with any arrangement of a plurality of subsystems.

As illustrated in FIG. 2, the fabric 202 is placed high within the hierarchy of fabrics, with direct access to the memory subsystem 126. The fabric 204 is below the fabric 202, and accesses the memory subsystem 126 through the fabric 204. Accordingly, the fabric 204 may wake the fabric 202 from an S0ix sleep state in order to access the memory subsystem 126. Similarly, the fabric 206 is below the fabric 204 and the fabric 202. The fabric 206 accesses the memory subsystem 126 through the fabric 204 and the fabric 202. Accordingly, the fabric 204 may wake the fabric 204 and the fabric 202 from an S0ix sleep state in order to access the memory subsystem 126. As illustrated in FIG. 2, the modem 122 has been connected higher up in the fabric hierarchy to reduce the memory access latency of the modem 122. In other words, the location of the modem 122 in the fabric hierarchy is intended to reduce the amount of time it takes the modem 122 to access the memory subsystem 126.

Figure 3:
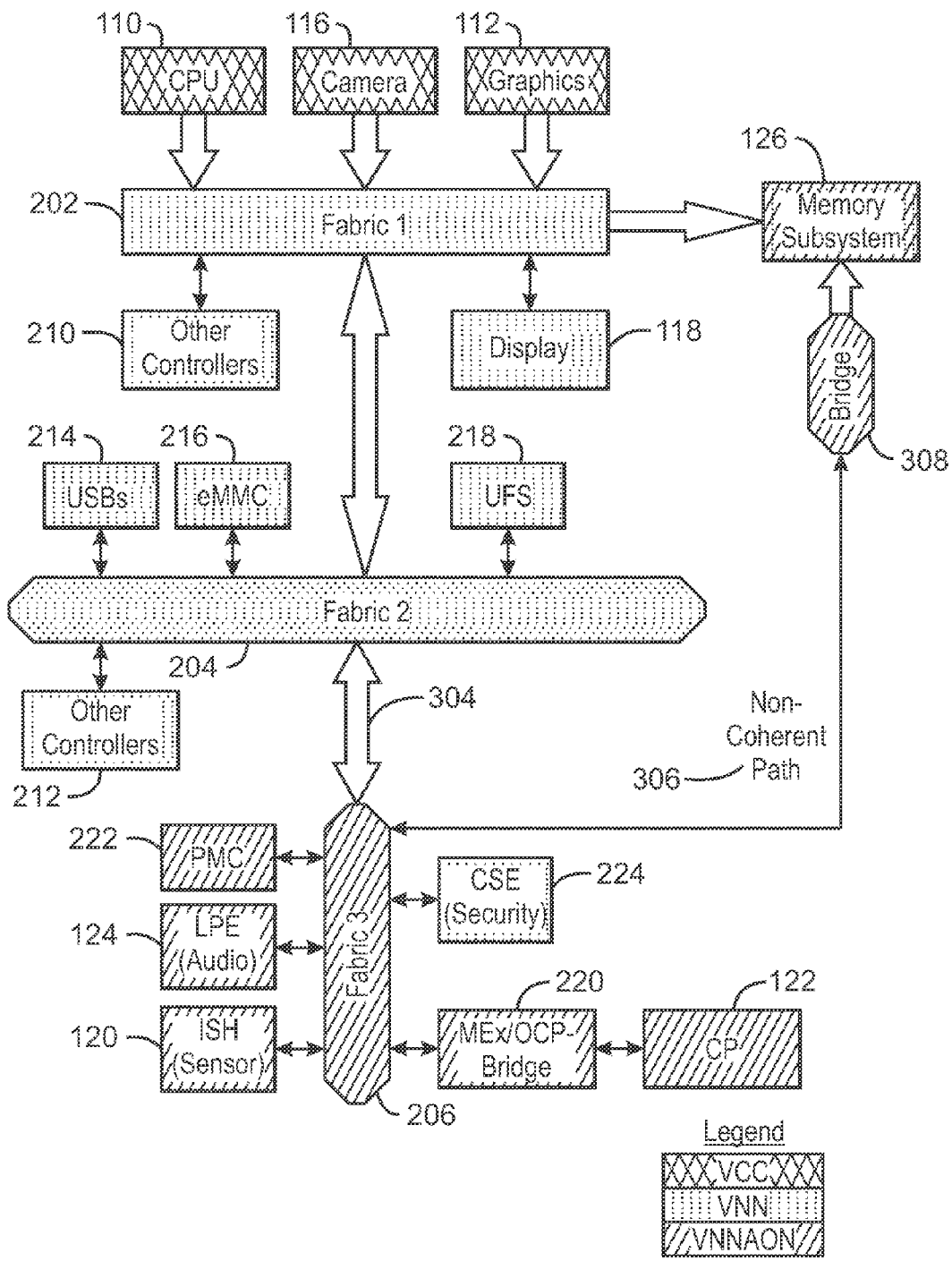
FIG. 3 is a block diagram of an SOC with an Always On (AON) fabric.

FIG. 3 is a block diagram of an SOC 300 with an Always On (AON) fabric 206. The SOC 300 includes a fabric 202 and a fabric 204. However, autonomous subsystems are relocated onto the AON fabric 206. The autonomous subsystems include subsystems that are can access the memory subsystem 126 independently while the remainder of the SOC 300 is in a sleep state. In some cases, this AON fabric is powered in all system states.

The AON fabric 206 can split coherent and non-coherent traffic onto different paths through the system. Coherent data can include data that is shared across nodes within the SOC 300. For purposes of data consistency, a coherent data path 304 routes the coherent data through other fabrics of the SOC 300. A non-coherent data path 306 routes the non-coherent data to the memory subsystem 126 without accessing the fabric 204 or the fabric 202. A small bridge 308 is used to take the non-coherent traffic from the AON fabric 206 from the non-coherent data path 306 and sent to the memory subsystem 126.

For the portion of memory accessed by the low-power bypass path that carries non-coherent traffic, a channel interleave could be optimized for power rather than for performance. This channel interleave reduces the number of data units (Dunits) activated for a particular device's accesses and also keep more DRAM chips in self refresh. In examples, a Dunit is used to generate the commands or instructions necessary to carry out the memory access requests. The Dunit may also queue up the packets including the commands or instructions for transmission across a memory bus. Furthermore, the Dunit also synchronizes data transfers that cross a clock boundary between the core frequency and the base frequency of the memory bus.

As illustrated in FIG. 3 the subsystems of the SOC 300 can operate drawing power from various supply rails. The CPU 110, camera 116, and the GPU 112 may draw power from the $V_{cc}$ power supply rail, indicated by the cross-hatching on each of these components. Similarly, the fabric 202, other controllers 210, display 118, USB subsystem 214, eMMC subsystem 216, UFS subsystem 218, fabric 204 and CSE 224 can be powered using the $V_{NN}$ power supply rail. This is illustrated by the dots through each of these components. The PMC 222, audio subsystem 124, sensor hub 120, OCP bridge 220 and modem 122 can be powered using the $V_{NNAON}$ power supply rail. This is illustrated by the diagonal lines through each of these components. The memory subsystem 126 may be powered according to the component accessing the memory subsystem 126. As illustrated by diagonal lines and dots through the memory subsystem 126, the memory subsystem 126 may receive power from the $V_{NN}$ power supply rail or the $V_{NNAON}$ power supply rail.

In the case of a long-term evolution (LTE) modem, there is a stringent memory access latency requirement of ~300 ns, which required it to be connected very close to Dunits. The particulars of the LTE standard are noted in various 3GPP Releases. The present techniques enable a dedicated AON path for memory access by an LTE modem. As a result, the modem attach point can be relocated to a lower position in the fabric hierarchy. In some cases, each of the subsystems connected by an AON fabric, including the AON fabric itself, runs using a calibrated ring oscillator clock. A calibrated ring oscillator clock can be used to prevent the power use associated with powering up the phase locked loop (PLL) clock generators. Accordingly, the present techniques can be used to support various modems with low memory access latency requirements, without re-architecting the internal modem subsystems to support low latency.

In examples, an SOC as described herein may be included in a mobile device. Components of the mobile device may be always on. For example, the modem may ping a base station at regular intervals in order to sync the mobile device with the base station. Communicating with the base station may also include accessing the memory subsystem. By classifying memory accesses according to the subsystem, memory accesses are not treated equally across the SOC. When an autonomous subsystem accesses memory on an SOC, the accesses can use a low bandwidth, low latency path to memory when the data is non-coherent. In this manner, the cost of waking the entire SOC—which is designed to access a large portion of a data with a high bandwidth—can be avoided. As a result, the present techniques can reduce energy consumption by the SOC.

Figure 4:
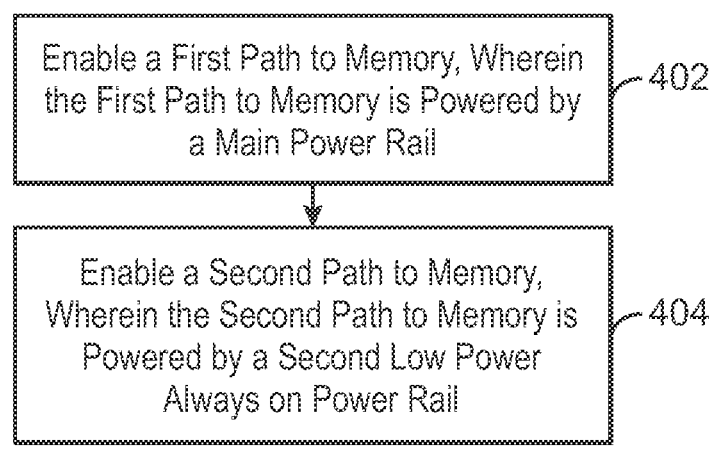
FIG. 4 is a process flow diagram of a method to enable an Always On path to memory.

FIG. 4 is a process flow diagram of a method 400 to enable an Always On path to memory. At block 402, a first power path to memory is enabled. In some cases, the first power path to memory is a main path to memory. The main path to memory can be used by coherent traffic and can support a very high data bandwidth. Further, the first path to memory may be powered by a main power rail. At block 404, a second power path to memory is enabled. The second path to memory is to be always on and low power. The Always On path is used by non-coherent traffic and is optimized for low power data transfer. The second path to memory may be powered by a second lower power, always on power rail. The second power rail may be lower power when compared to a main power rail. In some cases, the second power rail is lower power when compare to other power rails of the system. The first power path to memory and the second power path to memory are not enabled in any particular order. Rather, the second power path may be enabled before the first power path or the first power path and the second power path are enabled at the same time.

In examples, as the number of wakes increases within a system, power use may remain flat or stable according to the present techniques. Accordingly, the present techniques result in significant power savings when compared to systems without an Always on path to memory. Moreover, the present techniques can be useful with mobile devices, as mobile devices typically have a high number of applications (apps) that run in background and cause frequency system wakes.

The present techniques can also reduce overall system energy by not having to exit deepest S0ix states. As discussed, any memory access from autonomous subsystems can wake an entire SOC and cause the entire SOC to exit a deep S0ix state. This results in extra power lost in transitional energy by going in and out of deep S0ix states. In a conventional SOC, the projected energy consumed while saving and restoring SOC states and charging bulk capacitors (for example, $V_{NN}$ and SRAM) can be around 100.2 micro-joules, which is more than 100 micro-watts for a save and restore each second. The transitional energy cost for going in and out of system sleep states can result in uncompetitive mobile devices with low battery life. In some examples, frequent wakes can result in not entering S0ix state at all. Additionally, with the conventional SOC, the latency to access main memory is dictated by deep S0ix exit latencies. Use cases may not allow for large memory access latencies and can prevent the subsystem from going into the deepest S0ix state to avoid the memory access latency. When subsystems are prevented from going into the deepest S0ix state, the floor power is increased and the system remains remaining in a shallower S0ix state. This results in wasted power. By relocating the autonomous subsystems to an always on fabric according to the present techniques, portions of the system can enter and remain in a deep sleep state while satisfying any latency requirements, thereby saving power.

The present techniques can take advantage of an increasing number of autonomous subsystems that are found as new use cases are discovered. These new autonomous subsystems can require the autonomous subsystem to be active in deep S0ix states. As a result of the limitations of a conventional SOC, subsystems tend to be designed with large internal SRAM sizes. For example, a sensor hub may have greater than 600 KB of SRAM, and a modem may have greater than 12.5 MB of SRAM. However, SRAM leakage power, especially in retention, keeps increasing as transistor size is scaled. Further, SRAM contributes to higher leakage power in deep sleep states. For example, a sensor hub may leak greater than 370 micro-watts of energy in a deep sleep state. The present techniques enable a reduction of SRAM sizes within such subsystems. Further, the present techniques enable a powering down part of the SRAM in a sleep state, thereby reducing leakage power and die area of the subsystems.

Moreover, particular use cases such as GeoFencing can be implemented using the present techniques. In some cases, GeoFencing enables an electronic device to define geographical boundaries. A global positioning system (GPS) or radio frequency identification (RFID) can be used to define the geographical boundaries. GeoFencing may be very energy inefficient when considering a high number of page misses per second when accessing memory and the high energy cost associated with each miss. Each miss typically requires bringing up of the $V_{NN}$ rail, and then powering on the remaining subsystems and entire fabric hierarchy. The present techniques enable drastically cutting down the energy cost associated with page misses and thus enabling such new use cases without much impact to battery life.

The present techniques also use fewer dependencies on shared resources, such as the fabric, clocking, and memory channel, so the main memory access latency can be reduced. Particularly, the internal scratch SRAM/Cache within each subsystem can be reduced. Moreover, a reduction in the architectural complexity of the current "main fabric" is enabled. The main fabric can be the fabric that connects the memory, CPU, GFx, display and ISP, such as fabric 1 202 (FIG. 2). Since latency is not a criteria for the main path according to the present techniques, the main fabric and path can be optimized only for bandwidth and thus be more a efficient path to memory. In examples, the present techniques require the autonomous subsystems to be placed near each other on the same fabric. This allows creating a single big AON power island, instead of small scattered AON islands all over the SOC, which helps in implementation.

Further, the present techniques open the opportunity for repartitioning, where all the autonomous AON subsystems can be moved to a separate companion die. This companion die can be manufactured using an extreme low leakage process. This results in manufacturing the SOC using a process tuned for the highest performance and moving all autonomous subsystems to a companion die which is manufactured on a different process optimized for extreme low leakage. A separate companion die can benefit from the low power memory path on die through a low latency link, such as low latency interface (LLI).

Example 1

An apparatus with an ultra low power architecture is described herein. The apparatus includes a first power supply rail and a second power supply rail. A plurality of subsystems are to be powered by the first power supply rail, and a plurality of autonomous subsystems are to be powered by the power supply rail. The second power supply rail is to be always on, always available, and low power.

The apparatus may be a system on chip. The autonomous subsystems can directly access a memory of the apparatus. A memory access by the plurality of autonomous subsystems does not exit an S0ix system state. Additionally, wherein an autonomous subsystem may be active during a deep S0ix sleep state. The apparatus may also include a coherent data path to a memory subsystem from the plurality of autonomous subsystems, and a non-coherent data path to a memory subsystem from the plurality of autonomous subsystems. The plurality of autonomous subsystems can be placed on a same fabric of the apparatus, or the plurality of autonomous subsystems can be moved to a separate companion die of the apparatus. The plurality of autonomous subsystems include sensor hub, modem, audio, any subsystem that can access memory independently, or any combination thereof. Further, the apparatus may be a mobile device. A high bandwidth path to memory may be enabled by first power supply rail, and the first power supply rail can be powered down during most states. A low bandwidth path to memory may be enabled using the always on, always available second power supply rail.

Example 2

A power management integrated circuit (PMIC) is described herein. The power management integrated circuit is operable to provide a plurality of power states, wherein the power management integrated circuit may be to transition an autonomous subsystem from a sleep state to an active state. The autonomous subsystem may be active and powered by a low power always on power supply while a second subsystem may be to remain in the sleep state.

The low power always on power supply may power a non-coherent data path to memory. The autonomous subsystem can use a non-coherent data path to access memory during a low power use case. Additionally, the power management integrated circuit can removes the second subsystem from the sleep state when the autonomous subsystem is provide coherent data on a coherent data path to memory. Further, the power management integrated circuit may not toggle a main power rail in response to a non-coherent memory access by the autonomous subsystem. The power management integrated circuit also can manage a plurality of autonomous subsystems. The plurality of autonomous subsystems may be places on a same fabric. A main memory access latency may be reduced. The autonomous subsystem and the second subsystem can be components of a system on chip. Also, the power management integrated circuit may enable a plurality of sleep states on a per subsystem basis.

Example 3

A method for providing an ultra low power architecture is described herein. The method includes enabling a first path to memory on a mobile system on chip, wherein the first path to memory may be powered by a main power rail. The method also includes enabling a second path to memory on the mobile system on chip, wherein the path to memory may be powered by a second low power, always on power rail. The first path to memory may be a high bandwidth, high latency data path. The second path to memory may be a low bandwidth, low latency data path. An autonomous subsystem can access the memory using the second path to memory, without a second subsystem exiting an S0ix system state. Further, the first path to memory may be a coherent data path to the memory subsystem from a plurality of autonomous subsystems. The second path to memory may be a non-coherent data path to a memory subsystem from a plurality of autonomous subsystems. Additionally, the second path to memory may be accessed by a plurality of autonomous subsystems that are placed on a same fabric of the mobile system on chip. The second path to memory may be accessed by a plurality of autonomous subsystems that are placed a separate companion die of the mobile system on chip. The autonomous subsystem may include a sensor hub, modem, audio, any subsystem that can access memory independently, or any combination thereof. The power use of the mobile system on chip may be reduced.

Example 4

An apparatus with an ultra low power architecture is described herein. The apparatus includes a first means to supply power to a memory device of the apparatus. The apparatus also includes a second means to supply power to the memory device of the apparatus, wherein the second means may be to be always on and low power.

A plurality of autonomous subsystems can be powered by the second means to supply power. The second means to supply power may power an always on, always available, low bandwidth and low latency data path to memory. A memory access by the plurality of autonomous subsystems may not exit an S0ix system state. Further, an autonomous subsystem may be active during a deep S0ix sleep state. The apparatus may include a coherent data path to a memory subsystem from the plurality of autonomous subsystems and a non-coherent data path to a memory subsystem from the plurality of autonomous subsystems. A plurality of autonomous subsystems may be placed on a same fabric of the apparatus. Additionally, the plurality of autonomous subsystems may be moved to a separate companion die of the apparatus. Further, the plurality of autonomous subsystems can include sensor hub, modem, audio, any subsystem that can access memory independently, or any combination thereof. The apparatus may be a mobile device. Also, the second means to supply power to the memory device may be enabled using the always on, always available second power supply rail.

Example 5

A system with an ultra low power architecture is described herein. The system includes a display, a radio, a memory and a processor. The memory may be to store instructions and that may be communicatively coupled to the display. The processor is communicatively coupled to the radio and the memory. The system also includes a first power supply rail and a second power supply rail. A plurality of subsystems are to be powered by the first power supply rail, and a plurality of autonomous subsystems are to be powered by the second power supply rail, wherein the second power supply rail is to be always on and always available.

The autonomous subsystems may directly access the memory via a low latency, low bandwidth path to memory. The memory access by the plurality of autonomous subsystems may not exit an S0ix system state. Further, the autonomous subsystem powered by the second power supply rail may be active during a deep S0ix sleep state in which the first power supply rail may be powered down. The system may also include a coherent data path to a memory subsystem from the plurality of autonomous subsystems that may be powered by the first power supply rail, and a non-coherent data path to a memory subsystem from the plurality of autonomous subsystems that may be powered by the second power supply rail. The plurality of autonomous subsystems may be placed on a same fabric of the system. Additionally, the plurality of autonomous subsystems may be moved to a separate companion die of the system. The plurality of autonomous subsystems can include a sensor hub, modem, audio, any subsystem that can access memory independently, or any combination thereof. The system can be a mobile device. A high bandwidth path to memory may be enabled by first power supply rail, which can be shut off most of the time. A low bandwidth path to memory may be enabled using the always on, always available second power supply rail.

It is to be understood that specifics in the aforementioned examples may be used anywhere in one or more embodiments. For instance, all optional features of the computing device described above may also be implemented with respect to either of the methods described herein or a computer-readable medium. Furthermore, although flow diagrams and/or state diagrams may have been used herein to describe embodiments, the present techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. An apparatus with an ultra low power architecture, comprising:
    a first power supply rail, wherein a plurality of subsystems are to be powered by the first power supply rail; and
    a second power supply rail, wherein a plurality of autonomous subsystems are to be powered by the second power supply rail, wherein the second power supply rail is to be always on, always available, and low power when compared to the first power supply rail;
    a coherent data path to a memory subsystem from the plurality of autonomous subsystems; and
    a non-coherent data path to a memory subsystem from the plurality of autonomous subsystems.

2. The apparatus of claim 1, wherein the apparatus is a system on chip.

3. The apparatus of claim 1, wherein the autonomous subsystems directly access a memory of the apparatus.

4. The apparatus of claim 1, wherein a memory access by the plurality of autonomous subsystems does not exit an S0ix system state.

5. The apparatus of claim 1, wherein an autonomous subsystem is active during a deep S0ix sleep state.

6. The apparatus of claim 1, wherein the plurality of autonomous subsystems are placed on a same fabric of the apparatus.

7. The apparatus of claim 1, wherein the plurality of autonomous subsystems are moved to a separate companion die of the apparatus.

8. The apparatus of claim 1, wherein the plurality of autonomous subsystems include sensor hub, modem, audio, any subsystem that can access memory independently, or any combination thereof.

9. The apparatus of claim 1, wherein the apparatus is a mobile device.

10. The apparatus of claim 1, wherein a high bandwidth path to a memory is enabled by the first power supply rail.

11. The apparatus of claim 1, wherein a low bandwidth path to a memory is enabled using the always on, always available second power supply rail.

12. A power management integrated circuit (PMIC) of a system, operable to provide a plurality of power states, wherein the power management integrated circuit is to transition an autonomous subsystem from a sleep state to an active state, and wherein the autonomous subsystem is active and powered by a low power always on power supply that is low power when compared to other power of the system, while a second subsystem is to remain in the sleep state, wherein the low power always on power supply is to power a non-coherent data path to memory.

13. The power management integrated circuit of claim 12, wherein the autonomous subsystem uses a non-coherent data path to access memory during a low power use case.

14. The power management integrated circuit of claim 12, wherein the power management integrated circuit is to remove the second subsystem from the sleep state when the autonomous subsystem is to provide coherent data on a coherent data path to memory.

15. The power management integrated circuit of claim 12, wherein the power management integrated circuit does not toggle a main power rail in response to a non-coherent memory access by the autonomous subsystem.

16. The power management integrated circuit of claim 12, wherein the power management integrated circuit manages a plurality of autonomous subsystems.

17. A method for providing an ultra low power architecture, comprising:
    enabling a first path to memory on a mobile system on chip, wherein the first path to memory is powered by a main power rail and the first path to memory is a high bandwidth, high latency data path; and
    enabling a second path to memory on the mobile system on chip, wherein the path to memory is powered by a second low power, always on power rail, that is low power when compared to the main power rail.

18. The method of claim 17, wherein second path to memory is a low bandwidth, low latency data path.

19. The method of claim 17, wherein an autonomous subsystem accesses the memory using the second path to memory, without a second subsystem exiting an S0ix system state.

20. The method of claim 17, wherein the first path to memory is a coherent data path to the memory subsystem from a plurality of autonomous subsystems.

21. The method of claim 17, wherein the second path to memory is a non-coherent data path to a memory subsystem from a plurality of autonomous subsystems.

22. The method of claim 17, wherein the second path to memory is accessed by a plurality of autonomous subsystems that are placed on a same fabric of the mobile system on chip.

* * * * *